United States Patent
Wood et al.

(10) Patent No.: US 10,267,578 B2
(45) Date of Patent: Apr. 23, 2019

(54) SHAPE MEMORY MATERIAL BASED THERMAL COUPLER/DECOUPLER AND METHOD

(71) Applicant: RAYTHEON COMPANY, Waltham, MA (US)

(72) Inventors: Adam C. Wood, Oro Valley, AZ (US); Charles J. Bersbach, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 401 days.

(21) Appl. No.: 14/818,177

(22) Filed: Aug. 4, 2015

(65) Prior Publication Data
US 2017/0038159 A1 Feb. 9, 2017

(51) Int. Cl.
| | |
|---|---|
| *F28F 13/00* | (2006.01) |
| *F42B 15/34* | (2006.01) |
| *F03G 7/06* | (2006.01) |
| *H05K 7/20* | (2006.01) |
| *H05K 7/14* | (2006.01) |
| *H01L 23/373* | (2006.01) |
| *H01L 23/433* | (2006.01) |
| *F28F 21/02* | (2006.01) |

(52) U.S. Cl.
CPC ............. *F28F 13/00* (2013.01); *F03G 7/065* (2013.01); *F42B 15/34* (2013.01); *H05K 7/20445* (2013.01); *F28F 21/02* (2013.01); *F28F 2013/006* (2013.01); *F28F 2013/008* (2013.01); *F28F 2255/04* (2013.01); *H01L 23/3737* (2013.01); *H01L 23/433* (2013.01); *H05K 7/1434* (2013.01)

(58) Field of Classification Search
CPC ........... F28F 2013/005; F28F 2013/006; F28F 2013/008; F28F 13/00; F42B 15/34; H05K 7/20445
See application file for complete search history.

(56) References Cited

U.S. PATENT DOCUMENTS

| | | | |
|---|---|---|---|
| 5,108,214 A | 4/1992 | Milam | |
| 6,351,383 B1 * | 2/2002 | Payton | F42B 15/08 165/80.3 |
| 6,404,636 B1 * | 6/2002 | Staggers | H05K 7/1434 165/185 |
| 6,953,910 B2 * | 10/2005 | Kautz | H05K 7/12 219/201 |
| 7,727,450 B1 * | 6/2010 | Berger | B29C 33/40 264/266 |
| 9,025,333 B1 * | 5/2015 | Spowart | F28F 13/00 165/276 |
| 2006/0141308 A1 * | 6/2006 | Becerra | F28F 13/00 429/413 |
| 2009/0092807 A1 * | 4/2009 | Hu | B29C 61/003 428/215 |

(Continued)

*Primary Examiner* — Devon Russell

(57) ABSTRACT

A thermal interface is provided. The thermal interface includes a shape memory material and a thermally-conductive material. The thermal interface is configured to be formed as a compressed thermal interface and as an expanded thermal interface. The compressed thermal interface is configured to partially fill a thermal gap between a first component and a second component. The expanded thermal interface is configured to substantially fill the thermal gap between the first and second components.

20 Claims, 4 Drawing Sheets

(56) References Cited

U.S. PATENT DOCUMENTS

| | | | |
|---|---|---|---|
| 2009/0277609 A1* | 11/2009 | Chang | B82Y 10/00 165/96 |
| 2010/0218716 A1* | 9/2010 | Havens | G01K 3/04 116/216 |
| 2013/0314202 A1* | 11/2013 | Bolton | F28F 13/00 337/299 |
| 2014/0338324 A1 | 11/2014 | Jasklowski | |
| 2015/0247262 A1* | 9/2015 | Tallury | D01F 8/06 428/373 |
| 2016/0017870 A1* | 1/2016 | Mather | F03G 7/065 60/527 |

* cited by examiner

US 10,267,578 B2

SHAPE MEMORY MATERIAL BASED THERMAL COUPLER/DECOUPLER AND METHOD

TECHNICAL FIELD

The present disclosure is directed, in general, to thermal couplers/decouplers and, more specifically, to a shape memory material based thermal coupler/decoupler and method.

BACKGROUND

Typically, missile systems that must operate for extended times in benign environments thermally couple internal electronics to the airframe to keep the electronics below their temperature limits. Conversely, missile systems that must operate in high speed flight in which the airframes reach temperatures well above the electronic limits generally use techniques to insulate the electronics from the airframe. A missile that operates both in a benign environment for extended periods and in high speed flight may have problems with electronics becoming too hot in the benign environment if the electronics are insulated from the airframe or becoming too hot in high speed flight if the electronics are coupled to the airframe.

Changing the thermal coupling at launch from coupled to insulated can alleviate these problems. For example, currently available techniques to accomplish this include fluid loops, phase-change materials, and axial movement of metallic wedges using shape memory metal to modify the coupling. However, these approaches prohibitively increase the mass, volume and/or cost of the missile.

SUMMARY

This disclosure provides a shape memory material based thermal coupler/decoupler and method.

In one embodiment, a thermal interface is provided. The thermal interface includes a shape memory material and a thermally-conductive material. The thermal interface is configured to be formed as a compressed thermal interface and as an expanded thermal interface. The compressed thermal interface is configured to partially fill a thermal gap between a first component and a second component. The expanded thermal interface is configured to substantially fill the thermal gap between the first and second components.

In another embodiment, a system is provided. The system includes a first component, a second component, and a thermal interface. The thermal interface includes a shape memory material and a thermally-conductive material. The thermal interface is configured to be formed as a compressed thermal interface and as an expanded thermal interface. The compressed thermal interface is configured to partially fill a thermal gap between the first component and the second component. The expanded thermal interface is configured to substantially fill the thermal gap between the first and second components.

In yet another embodiment, a method for providing a thermal coupler/decoupler for a system that includes a first component and a second component is provided. The method includes forming a thermal interface that includes a shape memory material and a thermally-conductive material. The thermal interface is configured to be formed as a compressed thermal interface and as an expanded thermal interface. The compressed thermal interface is configured to partially fill a thermal gap between the first component and the second component. The expanded thermal interface is configured to substantially fill the thermal gap between the first and second components.

Other technical features may be readily apparent to one skilled in the art from the following figures, descriptions, and claims.

BRIEF DESCRIPTION OF THE DRAWINGS

For a more complete understanding of the present disclosure, reference is now made to the following description taken in conjunction with the accompanying drawings, in which.

DETAILED DESCRIPTION

FIGS. 1 through 5B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented using any number of techniques, whether currently known or not. Additionally, the drawings are not necessarily drawn to scale.

Figure 1:
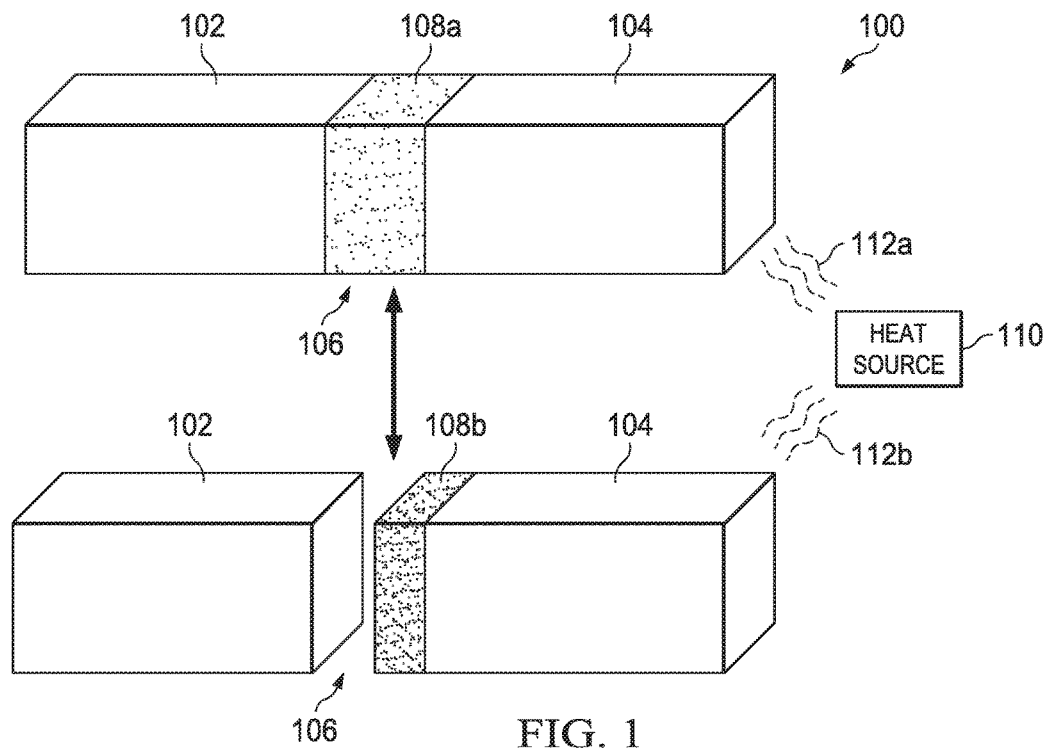
FIG. 1 illustrates a system for providing a shape memory material based thermal coupler/decoupler in accordance with an embodiment of the present disclosure.

FIG. 1 illustrates a system 100 for providing a shape memory material based thermal coupler/decoupler in accordance with an embodiment of the present disclosure. The embodiment of the system 100 shown in FIG. 1 is for illustration only. Other embodiments of the system 100 could be used without departing from the scope of this disclosure.

For the illustrated embodiment, the system 100 includes a first component 102 and a second component 104 that are separated by a thermal gap 106 and also includes a thermal interface 108 within the thermal gap 106 that is configured to form a thermal coupler or decoupler. The thermal interface 108 includes a shape memory material, such as a shape memory polymer or the like, and a thermally-conductive material, such as carbon fibers or the like.

The shape memory material of the thermal interface 108 may be formed in a honeycomb pattern, a cell pattern or any other suitable configuration based on the application in which the system 100 is to be implemented. Also, the thermally-conductive material may be embedded within the shape memory material, formed as a coating over the shape memory material, or included with the shape memory material in any other suitable manner.

The system 100 also includes a heat source 110 that is configured to generate thermal energy 112a-112b. The heat source 110 may represent a relatively hot environment or may represent a physical component of the system 100 that generates heat, such as a component that generates thermal energy 112 during operation, a heating element (e.g., an electric heater or the like) that is specifically configured to generate thermal energy 112 for the system 100, or other suitable source of heat.

The thermal interface 108 is configured to expand (as indicated by the expanded thermal interface 108a) or retract (as indicated by the compressed thermal interface 108b). As illustrated, the expanded thermal interface 108a is configured to substantially fill the thermal gap 106. However, the expanded thermal interface 108a may be configured in any suitable manner such that the expanded thermal interface 108a at least partially contacts both the first component 102 and the second component 104 to provide a heat dissipation path between the components 102 and 104. In addition, the compressed thermal interface 108b is configured to separate from at least the first component 102 such that the thermal gap 106 is partially opened, thereby providing thermal insulation between the first and second components 102 and 104.

For applications in which the thermal interface 108 is to function as a thermal decoupler, the thermal interface 108 may be initially formed as the compressed thermal interface 108b. The compressed thermal interface 108b may then be heated above the glass transition temperature of the shape memory material and reshaped to form the expanded thermal interface 108a, after which the expanded thermal interface 108a may be cooled below the glass transition temperature such that the expanded thermal interface 108a will remain stable at the cooler temperature.

The system 100 may then be formed to include the expanded thermal interface 108a as indicated in the upper portion of FIG. 1. Thus, for this embodiment, the thermal interface 108 initially provides a heat dissipation path from the first component 102 to the second component 104 or vice versa. At a later time, the heat source 110 generates thermal energy 112a that heats the system 100 above the glass transition temperature at least temporarily. When the system 100 reaches the glass transition temperature, the expanded thermal interface 108a will revert to the compressed thermal interface 108b, decoupling the first component 102 from the second component 104 and thereby providing thermal insulation between the components 102 and 104 via the opening in the thermal gap 106. In this way, the thermal interface 108, which is not required to be a structural member of the system 100, may be configured to function as a low-cost, lightweight thermal decoupler for the system 100.

For applications in which the thermal interface 108 is to function as a thermal coupler, the thermal interface 108 may be initially formed as the expanded thermal interface 108a. The expanded thermal interface 108a may then be heated above the glass transition temperature of the shape memory material and reshaped to form the compressed thermal interface 108b, after which the compressed thermal interface 108b may be cooled below the glass transition temperature such that the compressed thermal interface 108b will remain stable at the cooler temperature.

The system 100 may then be formed to include the compressed thermal interface 108b as indicated in the lower portion of FIG. 1. Thus, for this embodiment, the system 100 initially provides thermal insulation between the first component 102 and the second component 104 via the opening in the thermal gap 106. At a later time, the heat source 110 generates thermal energy 112b that heats the system 100 above the glass transition temperature at least temporarily. When the system 100 reaches the glass transition temperature, the compressed thermal interface 108b will revert to the expanded thermal interface 108a, coupling the first component 102 to the second component 104 and thereby providing a heat dissipation path from the first component 102 to the second component 104 or vice versa. In this way, the thermal interface 108, which is not required to be a structural member of the system 100, may be configured to function as a low-cost, lightweight thermal coupler for the system 100.

Therefore, using the system 100 with the thermal interface 108, for one example, internal electronics in a missile may be allowed to dissipate heat pre-launch and be insulated post-launch. In addition, the system 100 may be used as a thermal switch or sensor for an electrical circuit. For example, the system 100 may provide a failsafe switch to prevent damage caused by overheating. As a particular example, an over current condition that caused overheating could trigger the thermal interface 108 to decouple components 102 and 104 before damage could occur. For another example of a thermal switch, the thermal interface 108 could act as an activation switch to signal a user, engage a safety feature or trigger other suitable action based on temperature.

In addition, the thermal interface 108 could be used as a coupler in a satellite that includes the system 100. Because the environment during a satellite launch is hot and the environment while in orbit is cold, the thermal interface 108 may provide insulation during the launch and thermal coupling while the satellite is in orbit. For example, for a satellite launch, the satellite itself is underneath a nosecone, or shroud, that could protect the system 100 from most of the heat. Because the time to get into orbit is relatively short, the thermal interface 108 could be designed so that it would remain below the glass transition temperature during the launch, or remain below that temperature long enough that even if the compressed thermal interface 108b reverted to the expanded thermal interface 108a during launch, the electronics inside (e.g., the second component 104) would not have time to heat up enough to cause damage.

This approach may also be used to keep the electronics in a satellite insulated for a relatively long time (e.g., days, weeks or more). For this embodiment, the thermal interface 108 may be designed so that the electronics would initially be insulated and use a relatively small amount of power to stay warm over a certain number of orbits until the satellite is activated. For example, a constellation of communication and/or sensor nanosats put into orbit in preparation for a military mission may implement this embodiment, allowing the satellites to get into position and remain in orbit for a while with reduced size solar panels (if any at all) to keep them alive until the mission occurred and they were activated.

Although FIG. 1 illustrates one example of a system 100 for providing a shape memory material based thermal coupler/decoupler, various changes may be made to the embodiment shown in FIG. 1. For example, the makeup and arrangement of the system 100 are for illustration only. Components could be added, omitted, combined, subdivided, or placed in any other suitable configuration according to particular needs.

Figure 2:
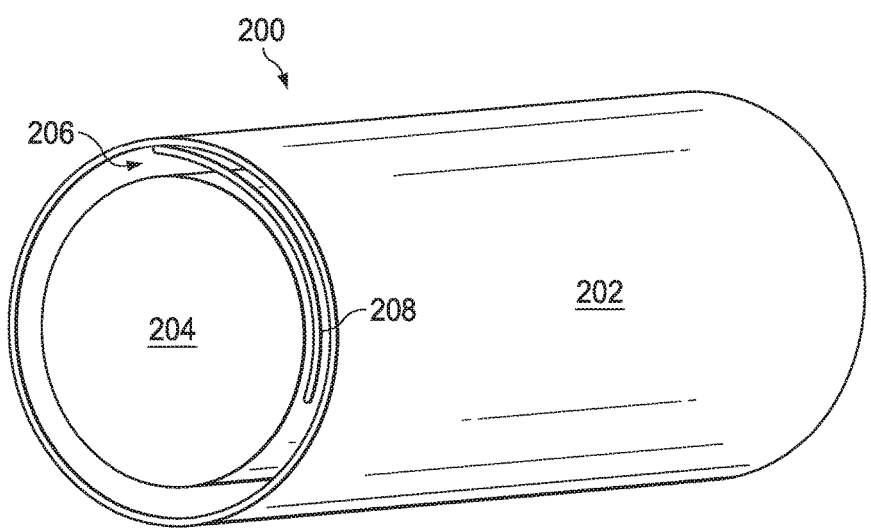
FIG. 2 illustrates a missile system including a shape memory material based thermal decoupler in accordance with a particular embodiment of the present disclosure.

FIG. 2 illustrates a missile system 200 including a shape memory material based thermal decoupler in accordance with a particular embodiment of the present disclosure. The embodiment of the missile system 200 shown in FIG. 2 is for illustration only. Other embodiments of the missile system 200 could be used without departing from the scope of this disclosure.

For the illustrated embodiment, the missile system 200 includes an airframe 202 and an internal hardware module 204 that are separated by a thermal gap 206 and also includes an expanded thermal interface 208 within the thermal gap 206 that is configured to form a thermal decoupler. The internal hardware module 204 may include electronics configured to operate certain functions of the missile system 200. The thermal interface 208 includes a shape memory material, such as a shape memory polymer or the like, and a thermally-conductive material, such as carbon fibers or the like.

The thermal interface 208 is initially formed as a compressed thermal interface (not shown in FIG. 2). The compressed thermal interface is then heated above the glass transition temperature of the shape memory material and reshaped to form the expanded thermal interface 208, after which the thermal interface 208 is cooled below the glass transition temperature such that the thermal interface 208 remains stable at the cooler temperature. The thermal interface 208 is configured in any suitable manner such that, when included between the airframe 202 and the internal hardware module 204, the thermal interface 208 at least partially contacts both the airframe 202 and the internal hardware module 204.

Thus, the thermal interface 208 initially provides a heat dissipation path from the internal hardware module 204 to the airframe 202. In this way, heat generated by operation of the internal hardware module 204 may be allowed to dissipate through the thermal interface 208 and the airframe 202. Before the missile system 200 is launched, the missile system 200 may be located in a relatively cool environment to allow for more efficient heat dissipation. At a later time, after the missile system 200 is launched, the missile system 200 is located in a relatively hot environment. At this point, the thermal energy generated by the environment and/or provided through active heating (e.g., using an electrical heater) heats the thermal interface 208 above the glass transition temperature of the shape memory material such that the thermal interface 208 reverts to its compressed form (not shown in FIG. 2). In this way, the thermal interface 208 may decouple the internal hardware module 204 from the airframe 202 such that the thermal gap 206 is partially opened, thereby insulating the internal hardware module 204 from the airframe 202, which may be relatively hot as a result of the environmental thermal energy. In this way, electronics in the internal hardware module 204 may be coupled to the airframe 202 pre-launch and then decoupled post-launch.

For a particular embodiment, the thermal interface 208 may form a relatively rigid bridge between the internal hardware module 204 and the airframe 202 prior to launch and then retract that bridge when the glass transition temperature is reached. Although illustrated as a relatively thin curved strip, the thermal interface 208 may be formed in any suitable manner. For a particular example, the thermal interface 208 may form a base ring with semicircular curved petals whose compressed, original shape has the petals pulled up against the base ring and whose expanded, temporary shape has the petals pulled out to form a larger diameter circle. A flexible and thermally-conductive material (e.g., carbon fibers or the like) may be embedded in the shape memory material of the thermal interface 208 so that the conductive material extends past the ends of the petals to make contact with the airframe 202 at the outer diameter and wraps around or routes through the base ring in order to make contact with the internal hardware module 204 on the inner diameter. For this particular example, when the airframe 202 heats up after launch, the petals would collapse down and pull the conductive material away from the airframe 202. Using a flexible thermally-conductive material allows good thermal contact to be achieved between surfaces in assembly procedures that involves sliding surfaces past one another (e.g., sliding the internal hardware module 204 into the airframe 202).

In this way, the missile system 200 allows for enhanced cooling of electronics in the internal hardware module 204 during factory testing, reprogramming, and any other operation of the electronics prior to missile launch. In addition, the missile system 200 maintains typical thermal isolation of the internal hardware module 204 from the airframe 202 that is found in high-speed weapons after launch once the shape memory material of the thermal interface 208 reaches the glass transition temperature.

Although FIG. 2 illustrates one example of a missile system 200 including a shape memory material based thermal decoupler, various changes may be made to the embodiment shown in FIG. 2. For example, the makeup and arrangement of the missile system 200 are for illustration only. Components could be added, omitted, combined, subdivided, or placed in any other suitable configuration according to particular needs.

Figure 3:
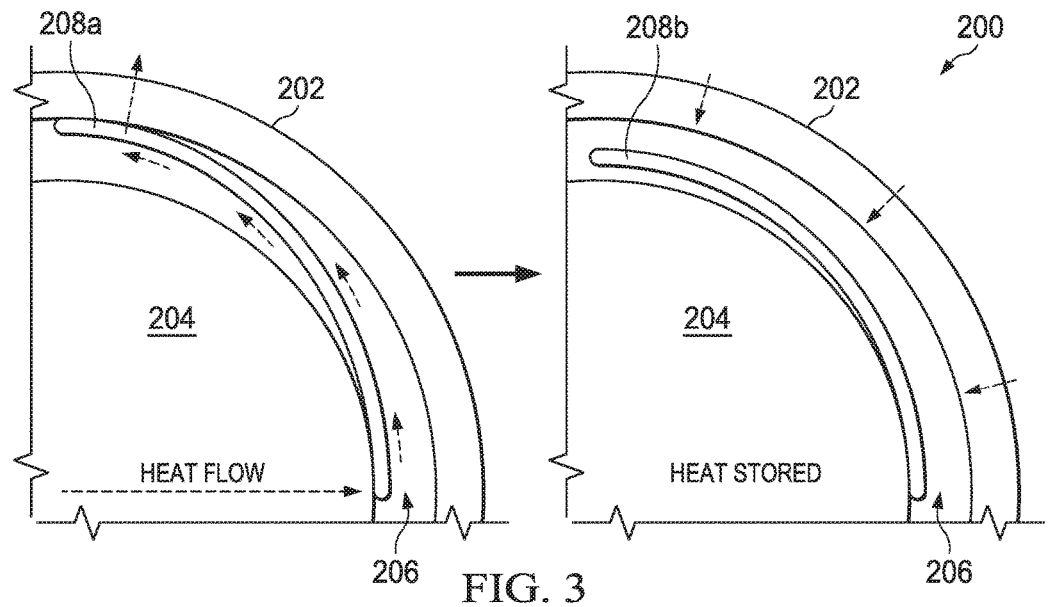
FIG. 3 illustrates details of a portion of the missile system of FIG. 2 in accordance with a particular embodiment of the present disclosure.

FIG. 3 illustrates details of a portion of the missile system 200 in accordance with a particular embodiment of the present disclosure. The embodiment of the missile system 200 shown in FIG. 3 is for illustration only. Other embodiments of the missile system 200 could be used without departing from the scope of this disclosure. For the illustrated embodiment, the thermal interface 208a-208b is represented by a relatively thin curved strip for ease of illustration and discussion. However, the thermal interface 208 may be formed in any suitable manner.

The left portion of FIG. 3 illustrates the heat flow, indicated by the gray arrows, in the missile system 200 pre-launch. Thus, for this portion, the thermal interface 208a is expanded to make contact with the airframe 202. Heat generated within the internal hardware module 204 is allowed to dissipate through the expanded thermal interface 208a, through the airframe 202 and out to the environment.

The right portion of FIG. 3 illustrates the change in heat flow in the missile system 200 post-launch. Thus, for this portion, the thermal interface 208b has reverted to its compressed form to break contact with the airframe 202 and provide thermal insulation between the internal hardware module 204 and the air frame 202. Heat generated within the internal hardware module 204 essentially remains stored within the internal hardware module 204, while thermal energy from the environment that heats the airframe 202 (indicated by the gray arrows) is prevented from reaching the internal hardware module 204 by the thermal gap 206.

Although FIG. 3 illustrates one example of a portion of the missile system 200, various changes may be made to the embodiment shown in FIG. 3. For example, the makeup and arrangement of the portion of the missile system 200 are for illustration only. Components could be added, omitted, combined, subdivided, or placed in any other suitable configuration according to particular needs.

Figure 4:
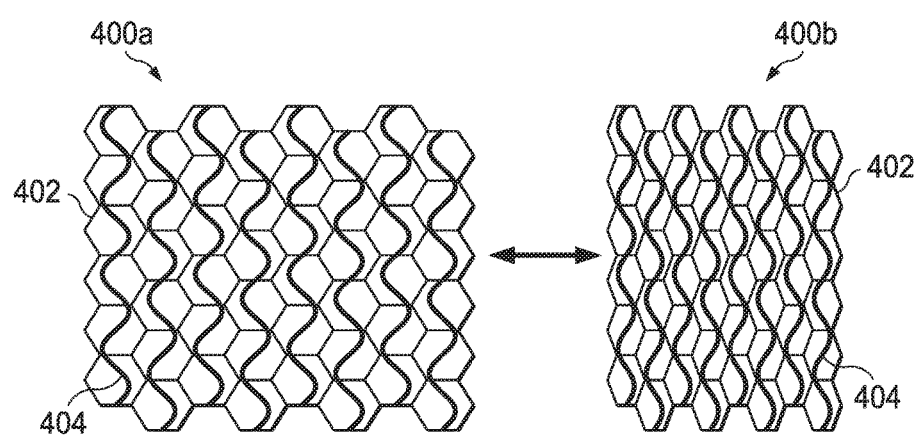
FIG. 4 illustrates details of a portion of the thermal interface of FIG. 1, 2 or 3 in accordance with a particular embodiment of the present disclosure.

FIG. 4 illustrates details of a portion of a thermal interface 400 in accordance with a particular embodiment of the present disclosure. The embodiment of the thermal interface 400 shown in FIG. 4 is for illustration only. Other embodiments of the thermal interface 400 could be used without departing from the scope of this disclosure. For some embodiments, the thermal interface 400 may represent the thermal interface 108 of FIG. 1 or the thermal interface 208 of FIGS. 2 and 3.

The thermal interface 400 is configured to form a thermal coupler or decoupler. The thermal interface 400 includes a shape memory material 402, such as a shape memory polymer or the like, and a thermally-conductive material 404, such as carbon fibers or the like. For the illustrated embodiment, the shape memory material 402 of the thermal interface 400 is formed in a honeycomb pattern, with the thermally-conductive material 404 embedded throughout the shape memory material 402. Although illustrated as strings winding through the shape memory material 402, it will be understood that the thermally-conductive material 404 may be formed and embedded within the shape memory material 402 in any suitable manner.

As described in more detail above, the thermal interface 400 is configured to expand (as indicated by the expanded thermal interface 400a) or retract (as indicated by the compressed thermal interface 400b). The expanded thermal interface 400a may be configured to substantially fill a thermal gap between components such that the expanded thermal interface 400a at least partially contacts both components. Thus, for some embodiments, the expanded thermal interface 400a may include a compliant, bendable structure that may be formed slightly larger than the thermal gap in order to ensure that good contact is made with both components when the thermal interface 400a is inserted into the thermal gap. The compressed thermal interface 400b is configured to partially fill the thermal gap in order to separate the components and provide thermal insulation between the components.

For applications in which the thermal interface 400 is to function as a thermal decoupler, the thermal interface 400 may be initially formed as the compressed thermal interface 400b. The compressed thermal interface 400b may then be heated above the glass transition temperature of the shape memory material and reshaped to form the expanded thermal interface 400a, after which the expanded thermal interface 400a may be cooled below the glass transition temperature such that the expanded thermal interface 400a will remain stable at the cooler temperature. A system, such as the system 100 or the missile system 200, may then be formed to include the expanded thermal interface 400a within a thermal gap between components, as indicated in the left portion of FIG. 4. Thus, for this embodiment, the thermal interface 400 initially provides a heat dissipation path between the components. At a later time, the system is heated above the glass transition temperature, and the expanded thermal interface 400a reverts to the compressed thermal interface 400b, thereby providing thermal insulation between the components, as indicated in the right portion of FIG. 4.

For applications in which the thermal interface 400 is to function as a thermal coupler, the thermal interface 400 may be initially formed as the expanded thermal interface 400a. The expanded thermal interface 400a may then be heated above the glass transition temperature of the shape memory material and reshaped to form the compressed thermal interface 400b, after which the compressed thermal interface 400b may be cooled below the glass transition temperature such that the compressed thermal interface 400b will remain stable at the cooler temperature. A system, such as the system 100, may then be formed to include the compressed thermal interface 400b within a thermal gap between components, as indicated in the right portion of FIG. 4. Thus, for this embodiment, the thermal interface 400 initially provides thermal insulation between the components. At a later time, the system is heated above the glass transition temperature, and the compressed thermal interface 400b reverts to the expanded thermal interface 400a, thereby providing a heat dissipation path between the components, as indicated in the left portion of FIG. 4.

Although FIG. 4 illustrates one example of a portion of a thermal interface 400, various changes may be made to the embodiment shown in FIG. 4. For example, the makeup and arrangement of the thermal interface 400 are for illustration only. Components could be added, omitted, combined, subdivided, or placed in any other suitable configuration according to particular needs.

Figure 5A:
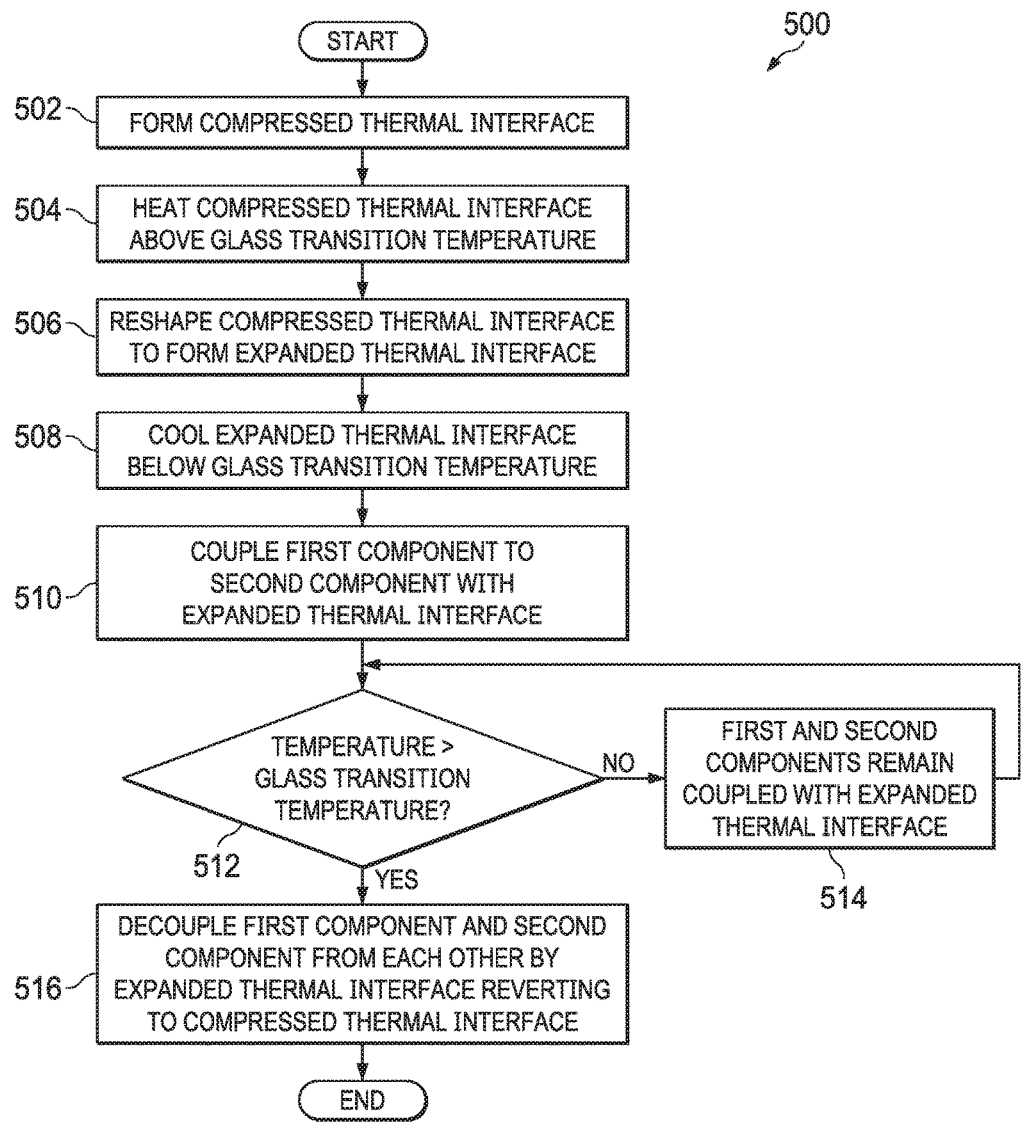
FIG. 5A is a flowchart illustrating a method for thermally decoupling a first component from a second component using a shape memory material in accordance with an embodiment of the present disclosure.

FIG. 5A is a flowchart illustrating a method 500 for thermally decoupling a first component 102 from a second component 104 using a shape memory material in accordance with an embodiment of the present disclosure. The method 500 shown in FIG. 5A is for illustration only. The first component 102 may be decoupled from the second component 104 in any other suitable manner without departing from the scope of this disclosure.

Initially, a compressed thermal interface 108b is formed from a shape memory material that includes a thermally-conductive material (step 502). The compressed thermal interface 108b is heated above the glass transition temperature of the shape memory material (step 504). The compressed thermal interface 108b is reshaped to form an expanded thermal interface 108a (step 506). The expanded thermal interface 108a is then cooled, or allowed to cool, below the glass transition temperature so that the expanded thermal interface 108a is stable in its form (step 508).

A first component 102 of a system 100 is coupled to a second component 104 of the system with the expanded thermal interface 108a (step 510). For example, for a particular embodiment, an airframe 202 of a missile system 200 may be coupled to an internal hardware module 204 of the missile system 200. While the temperature of the system 100 remains below the glass transition temperature (step 512), the first component 102 and the second component 104 remain coupled to each other with the expanded thermal interface 108a (step 514). For example, for a particular embodiment, the airframe 202 may remain coupled to the internal hardware module 204 before the missile system 200 is launched.

However, when the temperature of the system 100 rises above the glass transition temperature (step 512), either naturally or through intentional heating, the first component 102 and the second component 104 are decoupled from each other by the expanded thermal interface 108a reverting to the compressed thermal interface 108b (step 516). For example, for a particular embodiment, the temperature may rise when the missile system 200 is launched, resulting in the airframe 202 and the internal hardware module 204 being decoupled from each other. For some embodiments, the compressed thermal interface 108b may be coupled to the first component 102 when decoupled from the second component 104. For other embodiments, the compressed thermal interface 108b may be coupled to the second component 104 when decoupled from the first component 102.

Although FIG. 5A illustrates one example of a method 500 for thermally decoupling a first component 102 from a second component 104 using a shape memory material, various changes may be made to the embodiment shown in FIG. 5A. For example, while shown as a series of steps, various steps in FIG. 5A could overlap, occur in parallel, occur in a different order, or occur multiple times. For a particular example, a compressed thermal interface 108*b* could be formed between the first and second components 102 and 104 such that when the compressed thermal interface 108*b* is heated, the expanded thermal interface 108*a* may be formed between the components 102 and 104, thereby coupling the components 102 and 104 to each other when the expanded thermal interface 108*a* is shaped instead of in a separate, subsequent step.

Figure 5B:
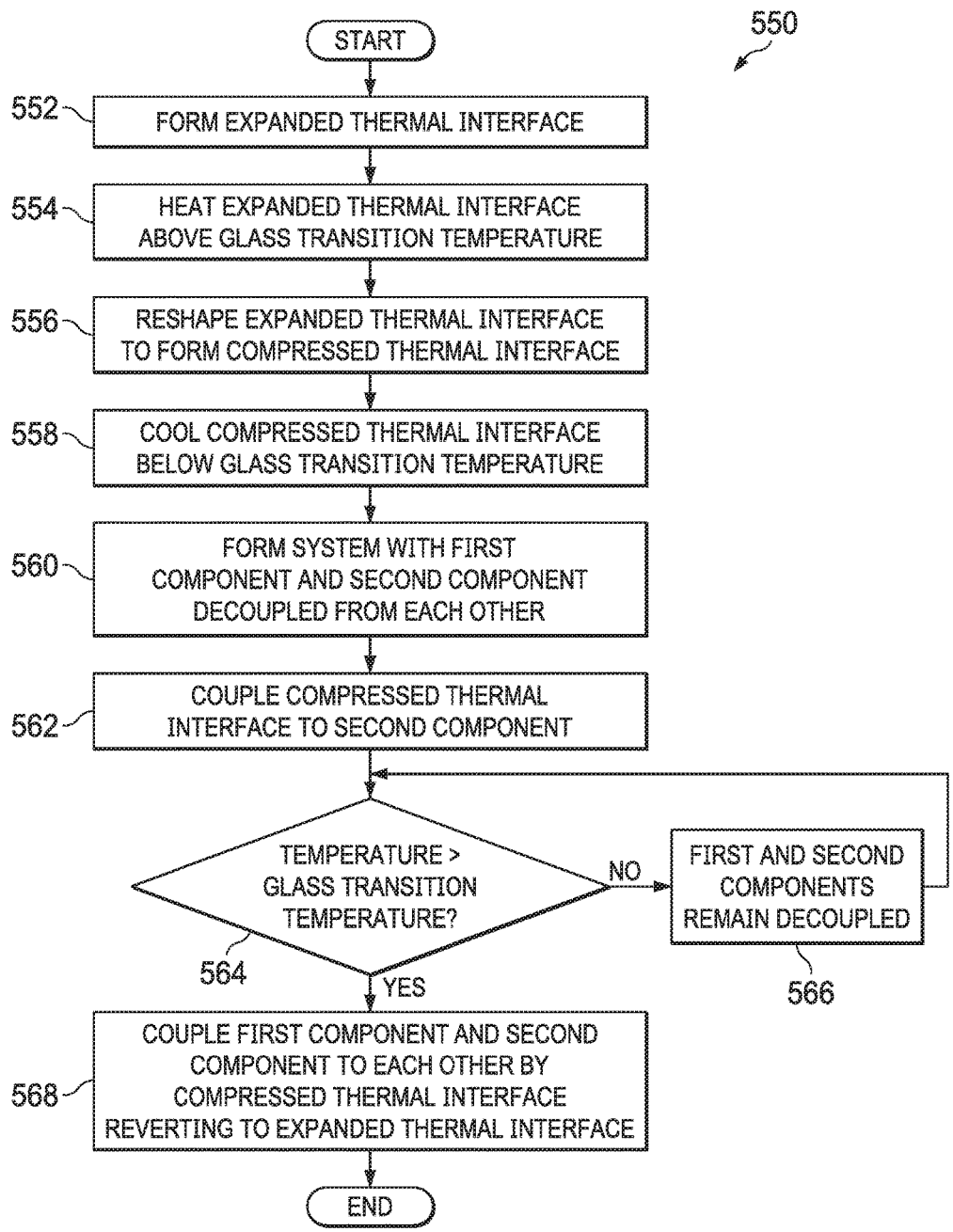
FIG. 5B is a flowchart illustrating a method for thermally coupling a first component to a second component using a shape memory material in accordance with an embodiment of the present disclosure.

FIG. 5B is a flowchart illustrating a method 550 for thermally coupling a first component 102 to a second component 104 using a shape memory material in accordance with an embodiment of the present disclosure. The method 550 shown in FIG. 5B is for illustration only. The first component 102 may be coupled to the second component 104 in any other suitable manner without departing from the scope of this disclosure.

Initially, an expanded thermal interface 108*a* is formed from a shape memory material that includes a thermally-conductive material (step 552). The expanded thermal interface 108*a* is heated above the glass transition temperature of the shape memory material (step 554). The expanded thermal interface 108*a* is reshaped to form a compressed thermal interface 108*b* (step 556). The compressed thermal interface 108*b* is then cooled, or allowed to cool, below the glass transition temperature so that the compressed thermal interface 108*b* is stable in its form (step 558).

A system 100 is formed with a first component 102 and a second component 104 decoupled from each other (step 560). The second component 104 is coupled to the compressed thermal interface 108*b*, which partially extends into a thermal gap 106 between the first and second components 102 and 104 (step 562).

While the temperature of the system 100 remains below the glass transition temperature (step 564), the first component 102 and the second component 104 remain decoupled from each other due to the compressed thermal interface 108*b* not filling the thermal gap 106 (step 566). However, when the temperature of the system 100 rises above the glass transition temperature (step 564), either naturally or through intentional heating, the first component 102 and the second component 104 are coupled to each other by the compressed thermal interface 108*b* reverting to the expanded thermal interface 108*a* and, thus, substantially filling the thermal gap 106 (step 568).

Although FIG. 5B illustrates one example of a method 550 for thermally coupling a first component 102 to a second component 104 using a shape memory material, various changes may be made to the embodiment shown in FIG. 5B. For example, while shown as a series of steps, various steps in FIG. 5B could overlap, occur in parallel, occur in a different order, or occur multiple times.

Modifications, additions, or omissions may be made to the apparatuses and methods described here without departing from the scope of the disclosure. For example, the components of the apparatuses may be integrated or separated. The methods may include more, fewer, or other steps. Additionally, as described above, steps may be performed in any suitable order.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The term "each" refers to each member of a set or each member of a subset of a set. Terms such as "over" and "under" may refer to relative positions in the figures and do not denote required orientations during manufacturing or use. Terms such as "higher" and "lower" denote relative values and are not meant to imply specific values or ranges of values. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A thermal interface comprising a shape memory material and a thermally-conductive material, wherein:
   the thermal interface is configured to be formed as a compressed thermal interface and as an expanded thermal interface, wherein the compressed thermal interface is configured to partially fill a thermal gap between a first component and a second component, and wherein the expanded thermal interface is configured to substantially fill the thermal gap,
   the thermal interface is configured to be formed as the expanded thermal interface when the thermal interface remains below a transition temperature of the shape memory material, and
   the thermal interface forms a base ring with a plurality of curved petals, the curved petals configured to move towards the base ring and to move away from the base ring.

2. The thermal interface of claim 1, wherein the transition temperature of the shape memory material is a glass transition temperature of the shape memory material, and wherein the thermal interface is configured to be formed as the compressed thermal interface when the thermal interface is heated above the glass transition temperature.

3. The thermal interface of claim 1, wherein the shape memory material comprises a shape memory polymer.

4. The thermal interface of claim 1, wherein the thermally-conductive material comprises carbon fibers.

5. The thermal interface of claim 1, wherein the shape memory material comprises a coating and the coating comprises the thermally-conductive material.

6. The thermal interface of claim 1, wherein the thermally-conductive material is embedded in the shape memory material.

7. The thermal interface of claim 1, wherein the shape memory material is formed in a honeycomb pattern.

8. The thermal interface of claim 1, wherein the thermally-conductive material is flexible, extends past ends of the curved petals, and wraps around or routes through the base ring.

9. A system, comprising:
   a first component;
   a second component; and
   a thermal interface comprising a shape memory material and a thermally-conductive material, wherein the thermal interface is configured to be formed as a compressed thermal interface and as an expanded thermal interface, wherein the compressed thermal interface is configured to partially fill a thermal gap between the first component and the second component, and wherein the expanded thermal interface is configured to substantially fill the thermal gap, wherein the thermal interface is configured to be formed as the expanded thermal interface when the thermal interface remains below a transition temperature of the shape memory material, and wherein the thermal interface forms a base ring with a plurality of curved petals, the curved petals configured to move towards the base ring and to move away from the base ring.

10. The system of claim 9, wherein the transition temperature of the shape memory material is a glass transition temperature of the shape memory material, and wherein the thermal interface is configured to be formed as the compressed thermal interface when the thermal interface is heated above the glass transition temperature.

11. The system of claim 9, wherein the second component comprises an airframe for a missile, and wherein the first component comprises an internal hardware module for the missile.

12. The system of claim 9, wherein the shape memory material comprises a shape memory polymer.

13. The system of claim 9, wherein the thermally-conductive material comprises carbon fibers.

14. The system of claim 9, wherein:
the first component is concentric with the second component; and
the thermal gap between the first component and the second component is an annulus.

15. The system of claim 9, wherein the thermally-conductive material is flexible, extends past ends of the curved petals, and wraps around or routes through the base ring.

16. A method for providing a thermal coupler/decoupler for a system comprising a first component and a second component, the method comprising:
forming a thermal interface comprising a shape memory material and a thermally-conductive material, wherein the thermal interface is configured to be formed as a compressed thermal interface and as an expanded thermal interface, wherein the compressed thermal interface is configured to partially fill a thermal gap between the first component and the second component, and wherein the expanded thermal interface is configured to substantially fill the thermal gap; and
coupling the first component to the second component with the expanded thermal interface;

wherein the thermal interface forms a base ring with a plurality of curved petals, the curved petals configured to move towards the base ring and to move away from the base ring.

17. The method of claim 16, wherein forming the thermal interface comprises:
forming the compressed thermal interface;
heating the compressed thermal interface above a glass transition temperature of the shape memory material, wherein a transition temperature of the thermal interface is the glass transition temperature;
reshaping the compressed thermal interface to form the expanded thermal interface; and
cooling the expanded thermal interface below the glass transition temperature.

18. The method of claim 16, further comprising decoupling the first component from the second component when the system reaches a temperature above a glass transition temperature by the expanded thermal interface reverting to the compressed thermal interface.

19. The method of claim 16, wherein the thermally-conductive material is flexible, extends past ends of the curved petals, and wraps around or routes through the base ring.

20. A thermal interface comprising a shape memory material and a thermally-conductive material, wherein:
the thermal interface is configured to be formed as a compressed thermal interface and as an expanded thermal interface, wherein the compressed thermal interface is configured to partially fill a thermal gap between a first component and a second component, and wherein the expanded thermal interface is configured to substantially fill the thermal gap,
the thermal interface is configured to be formed as the expanded thermal interface when the thermal interface remains below a transition temperature of the shape memory material,
the first component is concentric with the second component,
the thermal gap between the first component and the second component is an annulus, and
the thermal interface forms a base ring with a plurality of semicircular curved petals such that the curved petals of the compressed thermal interface are pulled up against the base ring and the curved petals of the expanded thermal interface form a circle of larger diameter than a diameter of the base ring.

* * * * *